(12) United States Patent
Ohtsuka et al.

(10) Patent No.: US 7,755,150 B2
(45) Date of Patent: Jul. 13, 2010

(54) MOS SOLID-STATE IMAGE PICKUP DEVICE AND MANUFACTURING METHOD THEREOF

(75) Inventors: Emi Ohtsuka, Toyama (JP); Mikiya Uchida, Kyoto (JP); Ryohei Miyagawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 366 days.

(21) Appl. No.: 11/808,042

(22) Filed: Jun. 6, 2007

(65) Prior Publication Data

US 2007/0284679 A1  Dec. 13, 2007

(30) Foreign Application Priority Data

Jun. 6, 2006  (JP) .............................. 2006-157407

(51) Int. Cl.
*H01L 27/14* (2006.01)
(52) U.S. Cl. ...................... 257/414; 257/431; 257/443; 257/446; 254/E31.073
(58) Field of Classification Search .......... 257/E31.073, 257/414, 369, 431, 443–444, 446
See application file for complete search history.

(56) References Cited

U.S. PATENT DOCUMENTS

| 6,023,293 | A | 2/2000 | Watanabe et al. |
| 6,218,691 | B1 * | 4/2001 | Chung et al. ................. 257/290 |
| 6,329,218 | B1 | 12/2001 | Pan |
| 7,005,690 | B2 | 2/2006 | Chijiwa et al. |

(Continued)

FOREIGN PATENT DOCUMENTS

CN   1722455 A   1/2006

(Continued)

OTHER PUBLICATIONS

European Search Report, issued in corresponding European Patent Application No. 07108249.9-1235, filed on Sep. 14, 2007.

(Continued)

*Primary Examiner*—Thanh Nguyen
(74) *Attorney, Agent, or Firm*—McDermott Will & Emery LLP

(57) ABSTRACT

An N-type epitaxial layer 115, which is formed above an N-type semiconductor substrate 114 in each of a pixel region and a peripheral circuit region; a first P-type well 1 formed above the N-type epitaxial layer 115 in the pixel region; and light receiving regions 117, which are formed within the first P-type well 1 and each of which is a component of a photodiode, are included. The peripheral circuit region includes: second P-type wells 2, which are formed from a surface 200 of the peripheral circuit region to a desired depth and each of which is a component of an N-Channel MOS transistor; an N-type well 3 which is formed from the surface 200 of the peripheral circuit region to a desired depth and which is a component of a P-Channel MOS transistor; and a third P-type well 4 which is formed so as to have such a shape as to isolate the N-type well 3 from the N-type epitaxial layer 115 and which has a higher impurity concentration than that of the first P-type well 1.

4 Claims, 14 Drawing Sheets

U.S. PATENT DOCUMENTS

| | | | |
|---|---|---|---|
| 7,030,918 B1 * | 4/2006 | Nakashiba | 348/294 |
| 2002/0009824 A1 * | 1/2002 | Maeda | 438/80 |
| 2006/0223257 A1 * | 10/2006 | Williams et al. | 438/202 |
| 2009/0134436 A1 * | 5/2009 | Nagano et al. | 257/291 |

FOREIGN PATENT DOCUMENTS

| | | |
|---|---|---|
| EP | 1 617 480 A2 | 1/2006 |
| JP | 2004-241577 | 8/2004 |

OTHER PUBLICATIONS

Chinese Office Action issued in Chinese Patent Application No. CN 2007101099438, dated Nov. 13, 2009.

* cited by examiner

MOS SOLID-STATE IMAGE PICKUP DEVICE AND MANUFACTURING METHOD THEREOF

BACKGROUND OF THE INVENTION

1. Field of the Invention

The present invention relates to a solid-state image pickup device, and particularly relates to a MOS solid-state image pickup device and a manufacturing method thereof.

2. Description of the Background Art

A solid-state image pickup device having an amplifying MOS transistor (hereinafter, referred to as a MOS solid-state image pickup device) has a photodiode and MOS transistor for each pixel, and, by using the MOS transistor, amplifies a signal detected by the photodiode. A quality of an image taken by the MOS solid-state image pickup device is similar to that of an image taken by a solid-state image pickup device having a CCD (Charge Coupled Device) (hereinafter, referred to as a CCD solid-state image pickup device). Further, by having a CMOS circuit, the MOS solid-state image pickup device consumes less power than the CCD solid-state image pickup device. Moreover, unlike the CCD solid-state image pickup device, the MOS solid-state image pickup device has an advantage that peripheral circuits and pixels of the device, which peripheral circuits are formed near a pixel region, can be manufactured by a same CMOS process.

In recent years, elements of a solid-state image pickup device have been reduced in size, whereby a space occupied by each photodiode of the device has decreased. As a result, it has become difficult to secure a sufficient number of saturated electrons stored in each photodiode. In order to solve this problem, there is a method in which a diffusion layer, in which a photodiode is formed, is deeply formed so as to secure the sufficient number of saturated electrons. However, since a power supply voltage of each transistor of the MOS solid-state image pickup device is low, image signal charge stored in the photodiode cannot be entirely read, and as a result, the image signal charge remains in the photodiode. This consequently causes a problem of residual image. For this reason, a voltage boosting circuit is provided, which boosts voltages of gate electrodes of a transfer transistor and reset transistor of the MOS solid-state image pickup device, such that the voltages become higher than an external power supply voltage of the MOS solid-state image pickup device. This allows the image signal charge stored in the photodiode to be entirely read, and prevents the image signal charge from remaining in the photodiode. As a result, the sufficient number of saturated electrons in the photodiode is secured, and the occurrence of residual image is inhibited.

FIG. 9 shows an example of the above-described MOS solid-state image pickup device having a voltage boosting circuit. As shown in FIG. 9, the MOS solid-state image pickup device comprises shift registers 10, a multiplexer 11, a voltage conversion circuit 12 (voltage boosting circuit) including a charge pump circuit, a pixel region 13, and row selection signal lines 14. Here, the shift registers 10, multiplexer 11 and voltage conversion circuit 12 are peripheral circuits of the solid-state image pickup device. In the pixel region 13, a large number of pixels are two-dimensionally arranged to form rows and lines of pixels. Each pixel comprises a photodiode, a transfer transistor which transfers image signal charge generated in the photodiode, a reset transistor, an amplifier transistor and the like. On a semiconductor substrate of the MOS solid-state image pickup device, N-Channel MOS transistors (hereinafter, referred to as NMOS) and P-Channel MOS transistors (hereinafter, referred to as PMOS) are formed. The voltage conversion circuit 12 has a CMOS transistor (hereinafter, referred to as CMOS).

Next, operations performed by the MOS solid-state image pickup device of FIG. 9 will be described. First, the shift registers 10 driven by a voltage of 3V, which is the same as an external power supply voltage, each output a signal for selecting a pixel row (hereinafter, referred to as a row selection signal) to the multiplexer 11 which is driven by a voltage of 3V. Next, when the row selection signal and a trans signal, which trans signal is inputted from the outside of the multiplexer 11, are inputted at the same time, the multiplexer 11 outputs the row selection signal to the voltage conversion circuit 12. In other words, the multiplexer 11 performs a logic operation AND for the row selection signal and trans signal. Next, after boosting the row selection signal from 3V to 5V, the voltage conversion circuit 12 inputs, via a row selection signal line 14, the row selection signal to a gate electrode of a transfer transistor of a pixel belonging to the selected row in the pixel region 13.

Note that, in the case where the MOS solid-state image pickup device does not have a voltage boosting circuit, the row selection signal outputted from the multiplexer 11 is inputted to the gate electrode of the transfer transistor via the row selection signal line 14, without being boosted.

As described above, by having a voltage boosting circuit, the conventional MOS solid-state image pickup device is able to limit the occurrence of residual image while securing the sufficient number of saturated electrons in each photodiode even if a space occupied by each photodiode is reduced. However, the conventional MOS solid-state image pickup device has a problem in that noise is transmitted to the pixel region 13 from the CMOS and the like which are components of the voltage conversion circuit 12 which is a peripheral circuit.

There are disclosed techniques to solve this problem, e.g., a technique disclosed in the Japanese Laid-Open Patent Publication No. 2004-241577. The technique disclosed by the Japanese Laid-Open Patent Publication No. 2004-241577 relates to a method for forming a N-type well of a PMOS by using a P-type semiconductor substrate. In this technique, a peripheral circuit region is surrounded by a deep N-type well such that a pixel region and the peripheral circuit region are electrically shielded from each other. This effectively reduces, in a MOS solid-state image pickup device having a voltage boosting circuit, influence from the noise which is transmitted to the pixel region from, e.g., a CMOS in the peripheral circuit region.

Generally speaking, crosstalk occurs more in the MOS solid-state image pickup device than in the CCD solid-state image pickup device, because of a pixel structure and principle of operation of the MOS solid-state image pickup device. Crosstalk is a phenomenon where signal charge (electrons) occurring in a pixel enters an adjacent pixel due to, e.g., dispersion.

FIG. 10 is a cross-sectional view showing a structure of a conventional MOS solid-state image pickup device which is capable of inhibiting crosstalk. Hereinafter, the conventional MOS solid-state image pickup device capable of inhibiting crosstalk will be described with reference to FIG. 10. As shown in FIG. 10, an N-type semiconductor substrate 101 (an N-type epitaxial layer may be included therein) has two pixel cells in an upper portion thereof. Each pixel cell includes an N-type light receiving section 117 of a photodiode, a light receiving section surface P-type region 120, gate oxide films 118 of transistors, gate electrodes 119, an element isolation section 116, and a P-type photodiode isolation region 104. A depletion layer 106 is generated around the N-type light receiving section 117. Here, in the N-type semiconductor substrate 101, a P-type well 1 is formed more deeply than the depletion layer 106. The P-type well 1 is a retrograde well which is formed such that the deeper the depth from a semiconductor substrate surface 200, the higher is impurity concentration of added impurities. This creates potential gradient within the P-type well 1. Here, a P-type high concentration impurity region 124 is a region where the impurity concentration is extremely high. The P-type high concentration impurity region 124 is formed below the N-type light receiving section 117 and the depletion layer 106, which are components of a photodiode.

With the above-described structure, electrons 107, which are generated within the depletion layer 106 by an incident light, drift due to the potential gradient within the depletion layer 106, and then gather in the N-type light receiving section 117 (i.e., $N^+$ region). In addition, electrons 109, which are generated outside the depletion layer 106 by the incident light, can also be efficiently gathered in the N-type light receiving section 117 by the potential gradient within the P-type well 1. Moreover, since the semiconductor substrate used here is of N-type, the electrons 109 generated below the P-type high concentration impurity region 124 by the incident light are absorbed by the N-type semiconductor substrate 101. As a result, the number of electrons 109 entering an adjacent pixel due to dispersion is decreased.

Note that, in the case of a CCD solid-state image pickup device, the N-type semiconductor substrate acts as an overflow drain. For this reason, signal charge (electrons) is inhibited from entering an adjacent pixel due to dispersion, and therefore a serious problem does not occur.

FIG. 11 shows another conventional MOS solid-state image pickup device which has a voltage boosting circuit and which is capable of limiting the occurrence of crosstalk (hereinafter, simply referred to as a conventional MOS solid-state image pickup device). Hereinafter, the conventional MOS solid-state image pickup device will be described with reference to FIG. 11. The right side of FIG. 11 shows a pixel region, and the left side of FIG. 11 shows a peripheral circuit region including a PMOS forming region and NMOS forming regions by which a CMOS is structured. The CMOS is driven by a high voltage having been boosted by a voltage boosting circuit. In the pixel region, the above-described conventional MOS solid-state image pickup device (see FIG. 10) which is capable of limiting the occurrence of crosstalk is formed.

As shown in FIG. 11, the conventional MOS solid-state image pickup device comprises an N-type semiconductor substrate 114, an N-type epitaxial layer 115, a P-type well 1, an N-type light receiving section 117, P-type wells 2, an N-type well 3, element isolation sections 116, a light receiving section surface P-type region 120, source-drain regions 122 of transistors, source-drain regions 123 of a transistor, gate insulating films 118, gate electrodes 119, and sidewall spacers 121. FIG. 11 does not show interlayer dielectrics, wirings, microlenses and the like.

In each of the pixel region and the peripheral circuit region, the N-type epitaxial layer 115 is formed to be positioned above the N-type semiconductor substrate 114. Here, for example, an impurity concentration of the N-type semiconductor substrate 114 is approximately $5E14/cm^3$, and an impurity concentration of the N-type epitaxial layer 115 is approximately $2E14/cm^3$. The P-type well 1, which is a retrograde well in which an impurity concentration increases in accordance with an increase in distance from the semiconductor substrate surface 200 toward an inner part of the substrate, is formed to be positioned above the N-type epitaxial layer 115. In the pixel region, the N-type light receiving section 117 is formed within the P-type well 1, and the light receiving section surface P-type region 120 is formed to be positioned at the semiconductor substrate surface 200. The P-type wells 2, which function as NMOS wells, are respectively formed in the NMOS forming regions so as to be positioned above the P-type well 1. The N-type well 3 functioning as a PMOS well is formed to be positioned above the P-type well 1 of the PMOS forming region. Here, a thickness of the N-type well 3 is the same as that of the P-type wells 2. The source-drain regions 122 of the transistors are formed to be positioned above the P-type wells 2. The source-drain regions 123 of the transistor are formed to be positioned above the N-type well 3. In the pixel and peripheral circuit regions, the element isolation sections 116 are formed to be positioned at the semiconductor substrate surface 200, and also, the gate insulating films 118, gate electrodes 119 and sidewall spacers 121 are formed to be positioned on the semiconductor substrate surface 200.

FIGS. 12 to 14 are cross-sectional views each showing manufacturing processes of the conventional MOS solid-state image pickup device (see FIG. 11). Hereinafter, a manufacturing method of the conventional MOS solid-state image pickup device will be described with reference to FIGS. 12 to 14. FIGS. 12 to 14 each show a pixel region on the right side thereof and a peripheral circuit region on the left side thereof.

First, as shown in FIG. 12, the N-type epitaxial layer 115 is grown on the N-type semiconductor substrate 114. Next, the element isolation sections 116 are formed at a surface of the N-type epitaxial layer 115. Here, for example, an impurity concentration of the N-type semiconductor substrate 114 is approximately $5E14/cm^3$, and an impurity concentration of the N-type epitaxial layer (N-) 115 is approximately $2E14/cm^3$. Next, the N-type light receiving section 117 is formed by implanting N-type impurities into the N-type epitaxial layer 115 of the pixel region. Then, the P-type well 1 is formed to a depth deeper than that of the N-type light receiving section 117 by performing ion implantation on the N-type epitaxial layer 115. This ion implantation is performed such that implanted impurities are distributed throughout an area between the semiconductor substrate surface 200 to a deep part of the N-type epitaxial layer 115. As a result, the P-type well 1 is formed to a depth of, e.g., 2 μm to 5 μm from the semiconductor substrate surface 200. Here, if boron (B) is implanted as impurities to be added, the ion implantation is performed, for example, at an implantation energy of 1000 keV to 3500 keV with a dose amount of $1E10/cm^2$ to $1E12/cm^2$. The P-type well 1 may be formed by a plurality of times of ion implantation.

Next, as shown in FIG. 13, the P-type wells 2 are respectively formed in the NMOS forming regions by ion implantation. The P-type wells 2 are formed to a depth of, e.g., 1 μm to 1.5 μm from the semiconductor substrate surface 200. Here, if boron (B) is implanted as impurities to be added, the ion implantation is performed, for example, at an ion implantation energy of 250 keV to 500 keV with a dose amount of $1E13/cm^2$ to $1E14/cm^2$.

Next, as shown in FIG. 14, the N-type well 3 is formed in the PMOS forming region by ion implantation. The N-type well 3 is formed to a same depth as that of the P-type wells 2, e.g., to the depth of 1am to 1.5 μm from the semiconductor substrate surface 200. Here, if phosphorus (P) is implanted as impurities to be added, the ion implantation is performed, for example, at an implantation energy of 500 keV to 700 keV with a dose amount of $1E13/cm^2$ to $1E14/cm^2$. Next, by performing ion implantation on a surface of each of the P-type wells 2 and N-type well 3, a channel region for controlling a threshold voltage VT of a transistor is formed on each of the NMOS forming regions and the PMOS forming region (not shown).

Next, as shown in FIG. 11, in the pixel region, in order to form a transfer transistor, the gate insulating film 118 which is composed of silicon oxide is formed, and then a gate electrode 119 which is composed of polycrystalline silicon is formed thereon. Next, the sidewall spacer 121 is formed at a side of the gate insulating film 118 and gate electrode 119. Similarly, in the peripheral circuit region, in order to form NMOSs and a PMOS, the gate insulating films 118 composed of silicon oxide are formed, and then the gate electrodes 119 composed of polycrystalline silicon are formed thereon. Next, the sidewall spacers 121 are formed at the sides of the gate insulating films 118 and gate electrodes 119. Next, the source-drain regions 122 of transistors are formed by performing N-type impurity ion implantation on a region which is within the pixel region and in which a transistor is formed, and on each of the NMOS forming regions in the peripheral circuit region. Next, the source-drain regions 123 of a transistor are formed by performing P-type impurity ion implantation on the PMOS forming region of the peripheral circuit region. Thereafter, interlayer dielectrics, wirings, microlenses and the like are formed (not shown). In the above-described method, the conventional MOS solid-state image pickup device shown in FIG. 11, which has a voltage boosting circuit and which is capable of limiting the occurrence of crosstalk, is manufactured.

However, the conventional MOS solid-state image pickup device (see FIG. 11) has the following problem. As shown in FIG. 11, the PMOS forming region which is a component of the voltage boosting circuit has a structure comprising, in descending order from the surface, the semiconductor substrate surface 200, N-type well 3, P-type well 1, N-type epitaxial layer 115 and the N-type semiconductor substrate 114. When the conventional MOS solid-state image pickup device is driven, the N-type epitaxial layer 115 and N-type semiconductor substrate 114 are grounded, and a high voltage having been boosted by the voltage boosting circuit is applied to the N-type well 3. When this high voltage is applied, there is a case where a depletion layer generated around the N-type well 3 expands in a direction of the N-type epitaxial layer 115, and eventually reaches the N-type epitaxial layer 115. In this case, there is a problem in that electric current occurs between the N-type well 3 and N-type epitaxial layer 115 (hereinafter, referred to as punch-through current).

Note that, for manufacturing a MOS solid-state image pickup device, a P-type semiconductor substrate is generally used. In this case, the problem of punch-through current between an N-type well of a PMOS and an N-type semiconductor substrate does not occur.

SUMMARY OF THE INVENTION

Therefore, an object of the present invention is to provide a MOS solid-state image pickup device and a manufacturing method thereof, which is capable of limiting the occurrence of crosstalk, and also preventing the above-described punch-through current even when inhibiting the occurrence of residual image by having a voltage boosting circuit.

The present invention is directed to a MOS solid-state image pickup device comprising, on an N-type semiconductor substrate, a pixel region, in which a plurality of pixels are formed, and a peripheral circuit region in which a peripheral circuit of the pixel region is formed. In order to achieve the above-mentioned object, in the MOS solid-state image pickup device of the present invention: the pixel region and the peripheral circuit region each include an N-type epitaxial layer which is formed above the N-type semiconductor substrate; the pixel region includes a first P-type well, which is formed above the N-type epitaxial layer, and light receiving regions, which are formed within the first P-type well and each of which is a component of a photodiode; and the peripheral circuit region includes second P-type wells, which are formed to a desired depth from a surface of the peripheral circuit region and each of which is a component of an N-Channel MOS transistor, an N-type well, which is formed to a desired depth from the surface of the peripheral circuit region and which is a component of a P-Channel MOS transistor, and a third P-type well which is formed so as to have such a shape as to isolate the N-type well from the N-type epitaxial layer and which has a higher impurity concentration than that of the first P-type well.

It is preferred that the first P-type well is a retrograde well having an impurity concentration which increases in accordance with an increase in depth from the surface of the pixel region and which is extremely high at a position deeper than that of a depletion layer generated around each light receiving region. The P-Channel MOS transistor may be driven by a voltage which has been boosted such that the voltage is higher than an external power supply voltage. An impurity concentration of the third P-type well is preferred to be no less than $10^{17}/cm^3$.

The present invention is also directed to a manufacturing method of a MOS solid-state image pickup device comprising, on an N-type semiconductor substrate, a pixel region, in which a plurality of pixels are formed, and a peripheral circuit region in which a peripheral circuit of the pixel region is formed. In order to achieve the above-mentioned object, the manufacturing method of the present invention comprises steps of: in the pixel and peripheral circuit regions, forming an N-type epitaxial layer above the N-type semiconductor substrate, and forming a first P-type well from a surface of the pixel and peripheral circuit regions to a depth deeper than that of a depletion layer generated around each of light receiving regions; in the pixel region, forming the light receiving regions within the first P-type well; in the peripheral circuit region, forming, within the first P-type well, second P-type wells, each of which is a component of an N-Channel MOS transistor, and an N-type well which is a component of a P-Channel MOS transistor; and below the N-type well, forming a third P-type well, whose impurity concentration is higher than that of the first P-type well, such that the third P-type well has such a shape as to isolate the N-type well from the N-type epitaxial layer.

In order to achieve the above-mentioned object, the manufacturing method alternatively comprises steps of: in the pixel and peripheral circuit regions, forming an N-type epitaxial layer above the N-type semiconductor substrate, and forming a first P-type well from a surface of the pixel and peripheral circuit regions to a depth deeper than that of a depletion layer generated around each of light receiving regions; in the pixel region, forming the light receiving regions within the first P-type well; in the peripheral circuit region, forming, within the first P-type well, a second P-type well which has a higher impurity concentration than that of the first P-type well and which is a component of each of N-Channel MOS transistors; and within the second P-type well, forming an N-type well which is a component of a P-Channel MOS transistor.

According to the above-described present invention, even if the MOS solid-state image pickup device has a voltage boosting circuit for inhibiting the occurrence of residual image, and an N-type semiconductor substrate is used for manufacturing the MOS solid-state image pickup device in order to limit the occurrence of crosstalk resulting from dispersion of signal charge (electrons), the occurrence of punch-through current is prevented. Further, according to the present invention, the above-described effect of the present invention can be obtained without requiring the number of manufacturing processes to be increased from the number of manufacturing processes of a conventional MOS solid-state image pickup device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
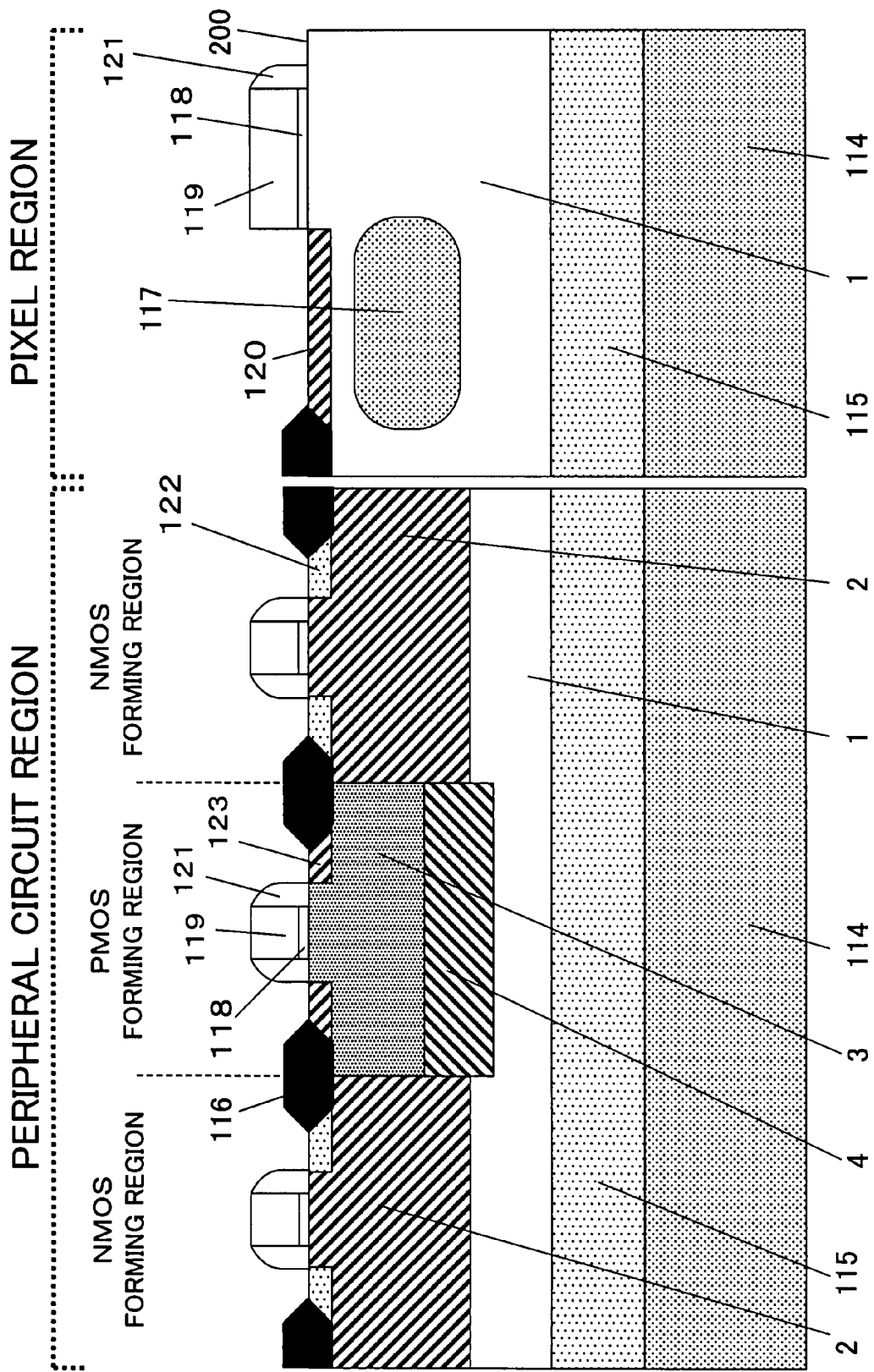
FIG. 1 shows a MOS solid-state image pickup device of a first embodiment.
Figure 10:
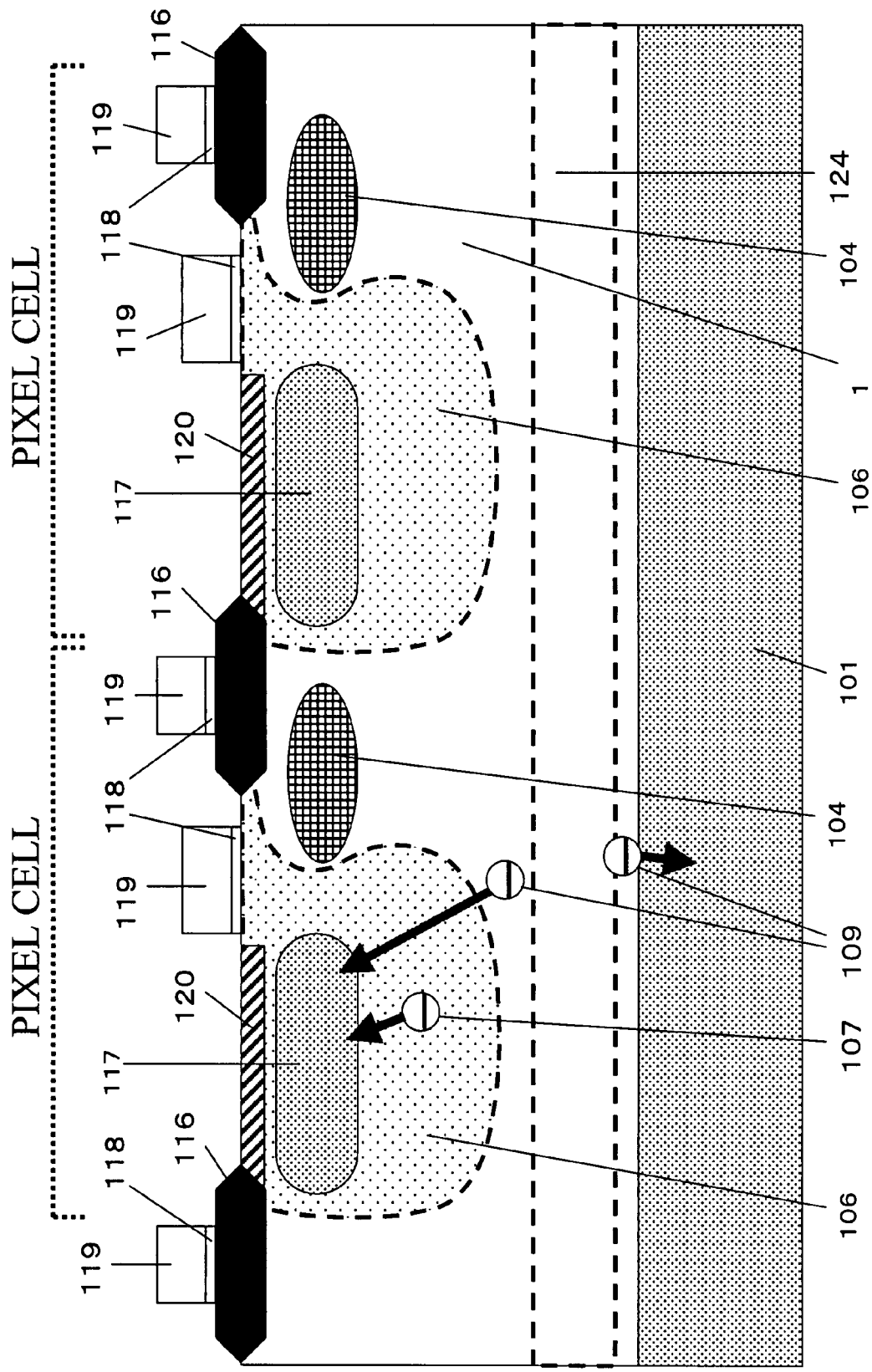
FIG. 10 is a cross-sectional view showing a structure of a conventional MOS solid-state image pickup device which is capable of limiting the occurrence of crosstalk.

FIG. 1 shows a MOS solid-state image pickup device of a first embodiment of the present invention. Hereinafter, the MOS solid-state image pickup device of the first embodiment will be described with reference to FIG. 1. The right side of FIG. 1 shows a pixel region, and the left side of FIG. 1 shows a peripheral circuit region in which a CMOS is formed and which includes a PMOS forming region and NMOS forming regions. The CMOS is driven by a high voltage having been boosted by a voltage boosting circuit. Here, the pixel region is formed so as to have a same structure as that of the above-described conventional MOS solid-state image pickup device (see FIG. 10) which is capable of inhibiting crosstalk. Note that, the pixel region generally includes a large number of pixels. However, in order to simplify the description below, it is assumed here that the pixel region includes only one pixel.

As shown in FIG. 1, the MOS solid-state image pickup device of the first embodiment comprises an N-type semiconductor substrate 114, an N-type epitaxial layer 115, a P-type well 1, an N-type light receiving section 117, P-type wells 2, an N-type well 3, a P-type well 4, element isolation sections 116, a light receiving section surface P-type region 120, source-drain regions 122 of transistors, source-drain regions 123 of a transistor, gate insulating films 118, gate electrodes 119 and sidewall spacers 121. Here, interlayer dielectrics, wirings, microlenses and the like are not shown in FIG. 1.

In each of the pixel region and peripheral circuit region, the N-type epitaxial layer 115 is formed so as to be positioned above the N-type semiconductor substrate 114. Here, for example, an impurity concentration of the N-type semiconductor substrate 114 is approximately $5E14/cm^3$, and an impurity concentration of the N-type epitaxial layer 115 is approximately $2E14/cm^3$. The P-type well 1, which is a retrograde well in which an impurity concentration increases in accordance with an increase in distance from the semiconductor substrate surface 200 toward an inner part of the substrate, is formed so as to be positioned above the N-type epitaxial layer 115. In the pixel region, the N-type light receiving section 117 is formed within the P-type well 1, and the light receiving section surface P-type region 120 is formed to be positioned at the semiconductor substrate surface 200. The P-type wells 2, which function as NMOS wells, are respectively formed in the NMOS forming regions so as to be positioned above the P-type well 1. The P-type well 4 is formed to be positioned above the P-type well 1 of the PMOS forming region. Here, the P-type well 4 has a higher impurity concentration than that of the P-type well 1. It is preferred that the impurity concentration of the P-type well 4 is no less than $10^{17}/cm^3$. The N-type well 3 functioning as a PMOS well is formed so as to be positioned above the P-type well 4 of the PMOS forming region. Here, the N-type well 3 is thinner than the P-type wells 2. The source-drain regions 122 of transistors are formed so as to be positioned above the P-type wells 2. The source-drain regions 123 of a transistor are formed to be positioned above the N-type well 3. In the pixel and peripheral circuit regions, the element isolation sections 116 are formed to be positioned at the semiconductor substrate surface 200, and also, the gate insulating films 118, gate electrodes 119 and sidewall spacers 121 are formed so as to be positioned on the semiconductor substrate surface 200.

The above described P-type well 4 as well as the P-type well 1 has a function to insulate the N-type well 3, which is a component of the PMOS, and the N-type epitaxial layer 115 from each other. Here, by setting the impurity concentration of the P-type well 4 to be higher than that of the P-type well 1, an insulation capability of the P-type well 4 is improved. For this reason, as compared with the conventional MOS solid-state image pickup device, the MOS solid-state image pickup device of the first embodiment has an improved characteristic for electrically isolating the N-type well 3 and the N-type epitaxial layer 115 from each other. As a result, the occurrence of punch-through current is prevented. In addition, the MOS solid-state image pickup device of the first embodiment (see FIG. 1) has a thicker P-type well, which is for insulating the N-type well 3 and the N-type epitaxial layer 115 from each other, than that of the conventional MOS solid-state image pickup device (see FIG. 11). For this reason, as compared with the conventional MOS solid-state image pickup device, the MOS solid-state image pickup device of the first embodiment has a further improved characteristic for electrically isolating the N-type well 3 and the N-type epitaxial layer 115 from each other. Consequently, the occurrence of punch-through current is further prevented.

Figure 2:
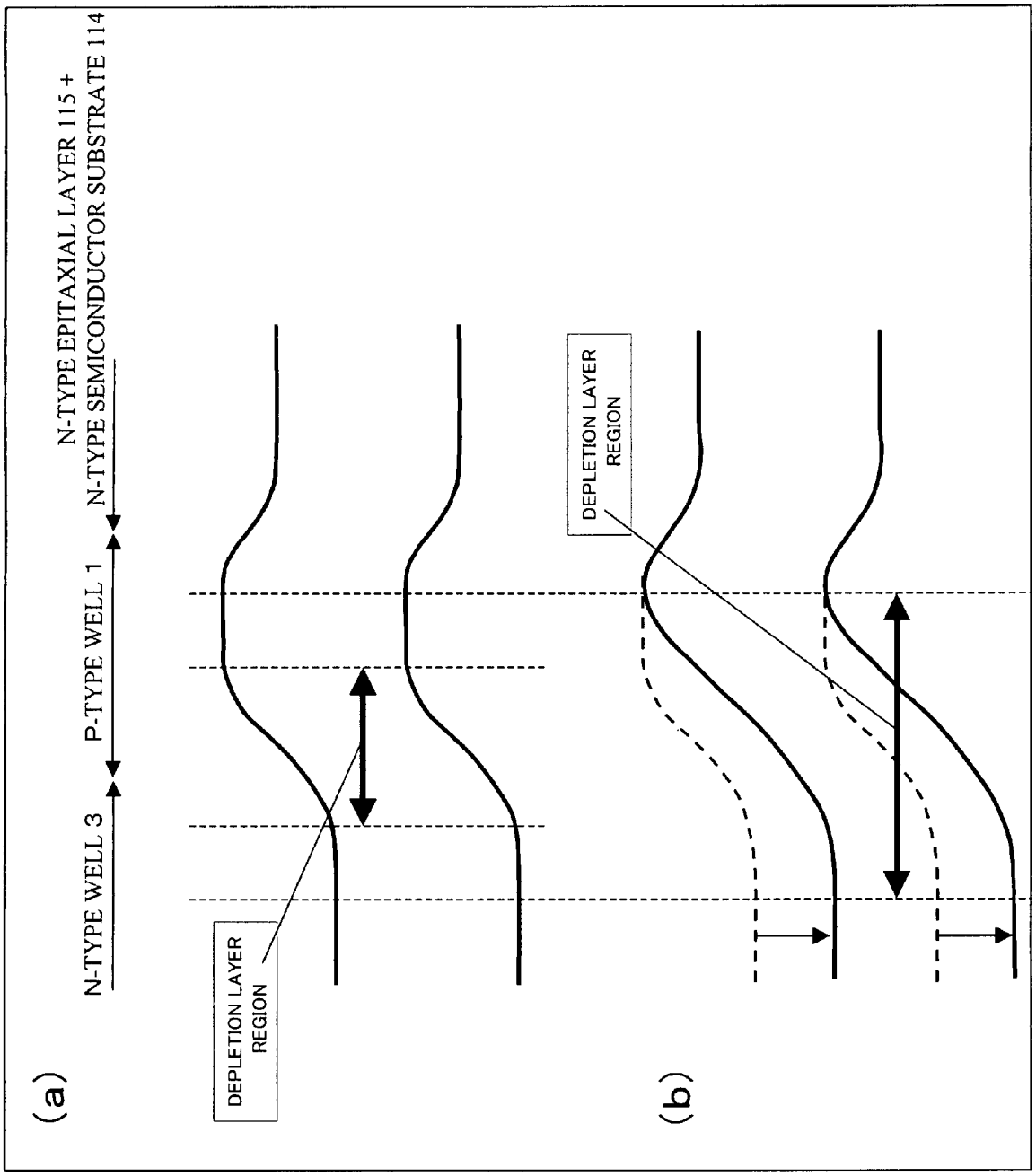
FIG. 2 is an energy band diagram showing, in a conventional MOS solid-state image pickup device, a change in internal potential, which change occurs in accordance with an increase in depth from an N-type well 3 of a PMOS toward an N-type epitaxial layer 115 and N-type semiconductor substrate 114, which PMOS is a component of a voltage boosting circuit.
Figure 3:
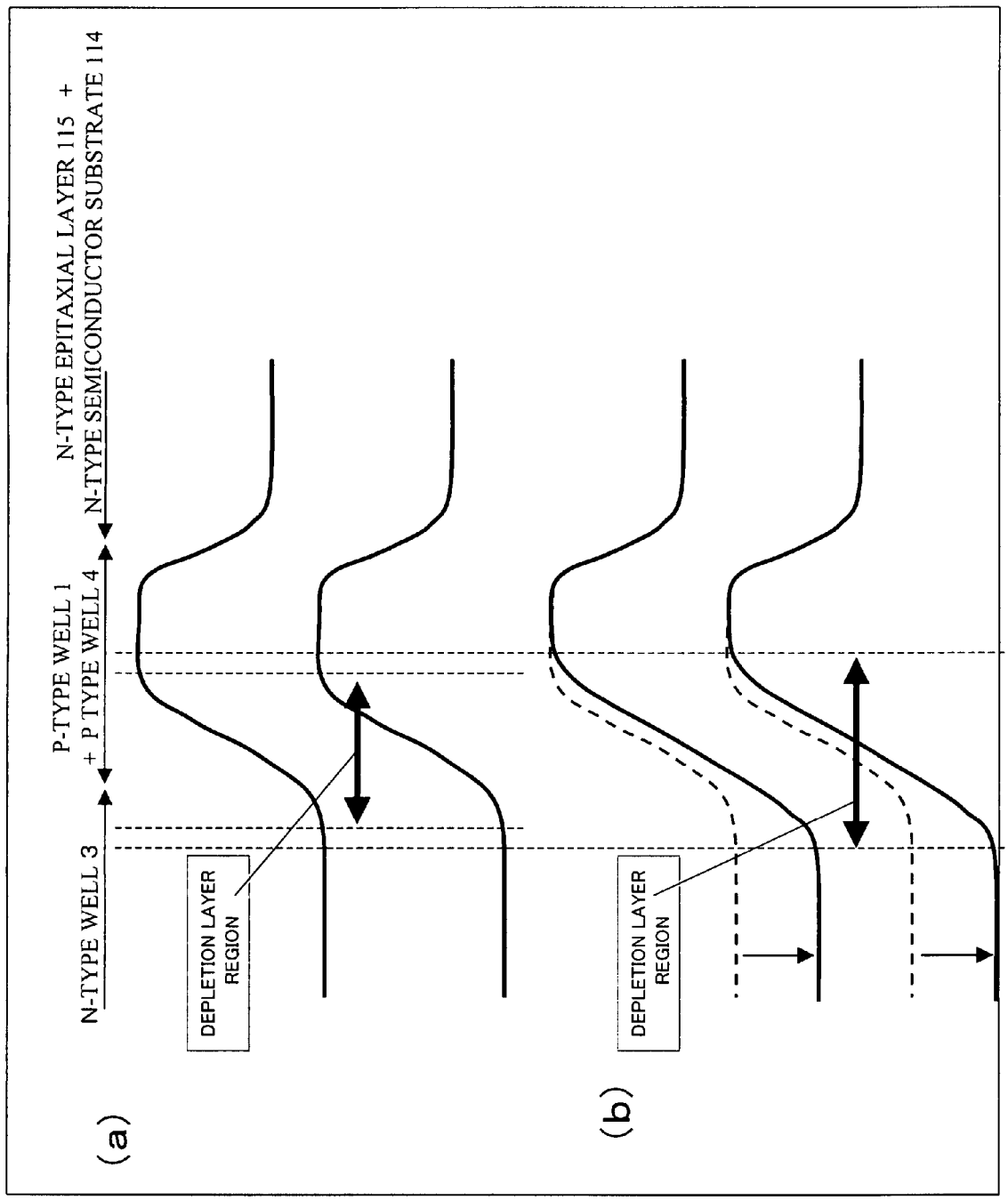
FIG. 3 is an energy band diagram showing, in the MOS solid-state image pickup device of the first embodiment, a change in internal potential, which change occurs in accordance with an increase in depth from an N-type well 3 of a PMOS toward an N-type epitaxial layer 115 and N-type semiconductor substrate 114, which PMOS is a component of a voltage boosting circuit.

FIG. 2 is an energy band diagram showing, in the conventional MOS solid-state image pickup device, a change in internal potential, which change occurs in accordance with an increase in depth from the N-type well 3 of the PMOS toward the N-type epitaxial layer 115 and N-type semiconductor substrate 114, which PMOS is a component of the voltage boosting circuit. FIG. 3 is an energy band diagram showing, in the MOS solid-state image pickup device of the first embodiment, a change in internal potential, which change occurs in accordance with an increase in depth from the N-type well 3 of the PMOS toward the N-type epitaxial layer 115 and N-type semiconductor substrate 114, which PMOS is a component of the voltage boosting circuit. Here, FIGS. 2 and 3 each show the internal potential in a longitudinal direction and a distance in a horizontal direction. FIG. 2(a) and FIG. 3(a) each show the internal potential which is obtained when a normal bias voltage (e.g., +3V) is applied to the N-type well 3. FIG. 2(b) and FIG. 3(b) each show the internal potential which is obtained when the voltage boosting circuit applies a high bias voltage (e.g., +5V) to the N-type well 3. Hereinafter, descriptions will be given with reference to FIGS. 2 and 3 for the punch-through current which occurs between: the N-type well 3; and the N-type epitaxial layer 115 and N-type semiconductor substrate 114.

First, a description for the conventional MOS solid-state image pickup device will be given. As shown in FIG. 2(a), there is a potential barrier from the N-type well 3 to the P-type well 1, which potential barrier prevents an electron from moving in a direction of the P-type well 1. Although the potential barrier becomes higher as shown in FIG. 2(b) when a high bias voltage (e.g., +5V) is applied to the N-type well 3 in order to drive the PMOS, a depletion layer region expands. Then, when the depletion layer region reaches the N-type epitaxial layer 115, the punch-through current occurs.

Next, a description for the MOS solid-state image pickup device of the first embodiment will be given. As shown in FIG. 3(a), there is a potential barrier from the N-type well 3 to the P-type well 1, which potential barrier prevents an electron from moving in a direction of the P-type well 1. This potential barrier is higher than that of FIG. 2(a) for the reason that the P-type well 4 having a higher impurity concentration than that of the P-type well 1 is formed. As shown in FIG. 3(b), when a high bias voltage (e.g., +5V) is applied to the N-type well 3 in order to drive the PMOS, the potential barrier is heightened and the depletion layer region expands. Here, since the impurity concentration of the P-type well 4 is higher than that of the P-type well 1, the depletion layer region does not expand more than as shown in FIG. 2(b). In addition, since the P-type well insulating the N-type well 3 and the N-type epitaxial layer 115 from each other is thicker than that of the conventional MOS solid-state image pickup device, there is less possibility for the depletion layer region to reach the N-type epitaxial layer 115, as compared with the conventional MOS solid-state image pickup device. Consequently, the MOS solid-state image pickup device of the first embodiment is more capable of preventing the occurrence of punch-through current than the conventional MOS solid-state image pickup device.

In the pixel region of the MOS solid-state image pickup device of the first embodiment, the P-type well 1 as described above in the background art is formed. As described therein, the P-type well 1 is a retrograde well, and has a P-type high concentration region 124 below the N-type light receiving section 117 (see FIG. 10). For this reason, the MOS solid-state image pickup device of the first embodiment is capable of preventing the occurrence of the above-described punch-through current as well as limiting the occurrence of crosstalk.

As described above, the MOS solid-state image pickup device of the first embodiment is capable of limiting the occurrence of crosstalk, and also, preventing the occurrence of punch-through current even when inhibiting the occurrence of residual image by having a voltage boosting circuit.

Figure 4:
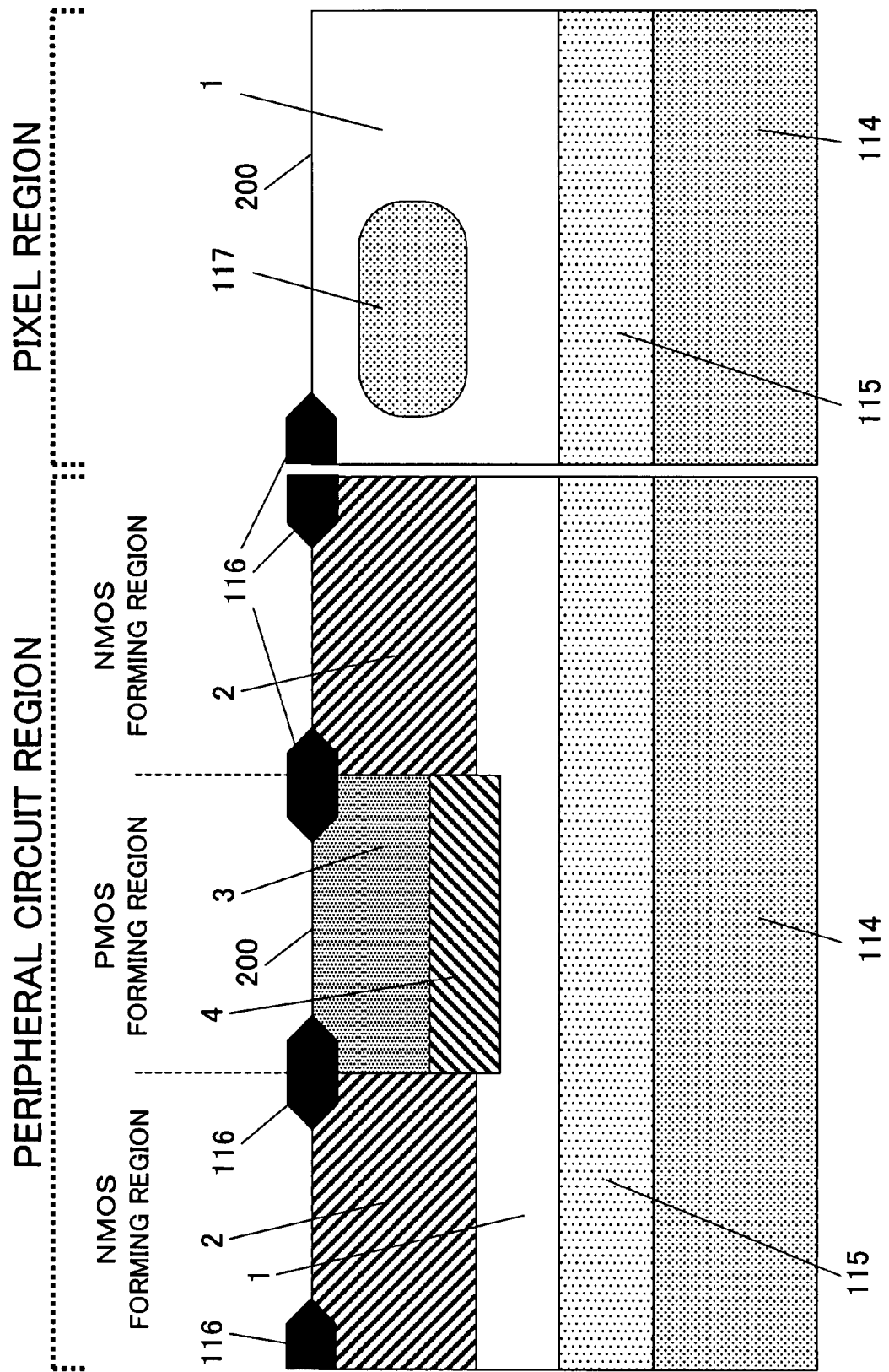
FIG. 4 is a cross-sectional view showing manufacturing processes of the MOS solid-state image pickup device of the first embodiment.

FIG. 4 shows a cross-sectional diagram showing manufacturing processes of the MOS solid-state image pickup device of the first embodiment. Hereinafter, a manufacturing method of the MOS solid-state image pickup device of the first embodiment will be described with reference to FIG. 4. Since manufacturing processes, which are prior to the manufacturing processes shown in FIG. 4, are the same as those described in the background art (FIGS. 12 and 13), descriptions thereof will be omitted. Here, the right side of FIG. 4 shows the pixel region, and the left side of FIG. 4 shows the peripheral circuit region.

First, the state as shown in FIG. 13 is obtained by the conventional manufacturing method described above in the background art (FIGS. 12 and 13). Next, as shown in FIG. 4, the N-type well 3 is formed in the PMOS forming region by ion implantation. At this point, a depth from the semiconductor substrate surface 200, to which depth the N-type well 3 is formed, is set to, e.g., 1 μm to 1.3 μm so as to be shallower than a depth from the semiconductor substrate surface 200, to which depth the P-type wells 2 are formed. Here, if phosphorus (P) is added as impurities, the ion implantation is performed, for example, at an ion implantation energy of 500 keV to 650 keV with a dose amount of 1E13/cm² to 1E14/cm². Next, the P-type well 4 is formed below the N-type well 3 by ion implantation. The P-type well 4 is formed at a depth of, e.g., 1.5 μm to 2 μm from the semiconductor substrate surface 200. Here, if boron (B) is added as impurities, the ion implantation is performed, for example, at an ion implantation energy of 350 keV to 600 keV with a dose amount of 1E13/cm² to 1E14/cm². Next, by performing ion implantation on a surface of each of the P-type wells 2 and on a surface of the N-type well 3, a channel region for controlling a threshold voltage VT of a transistor is formed on each of the NMOS forming regions and the PMOS forming region (not shown).

Then, as shown in FIG. 1, similarly to the conventional manufacturing method of the MOS solid-state image pickup device (see FIG. 11), in the pixel region, the gate electrode 119 is formed after the gate insulating film 118 is formed. Next, the sidewall spacer 121 is formed on the side of gate insulating film 118 and gate electrode 119. Similarly, in the peripheral circuit region, the gate electrodes 119 are formed after the gate insulating films 118 are formed. Next, the sidewall spacers 121 are formed on the sides of the gate insulating films 118 and gate electrodes 119. Next, in the pixel region, the source-drain regions 122 of a transistor are formed in a region where the transistor is formed. The source-drain regions 122 of transistors are also formed in the NMOS forming regions of the peripheral circuit region. Subsequently, the source-drain regions 123 are formed in the PMOS forming region. Thereafter, the interlayer dielectrics, wirings, microlenses and so on are formed. The MOS solid-state image pickup device of the first embodiment is thus manufactured by the above-described manufacturing method.

Figure 5:
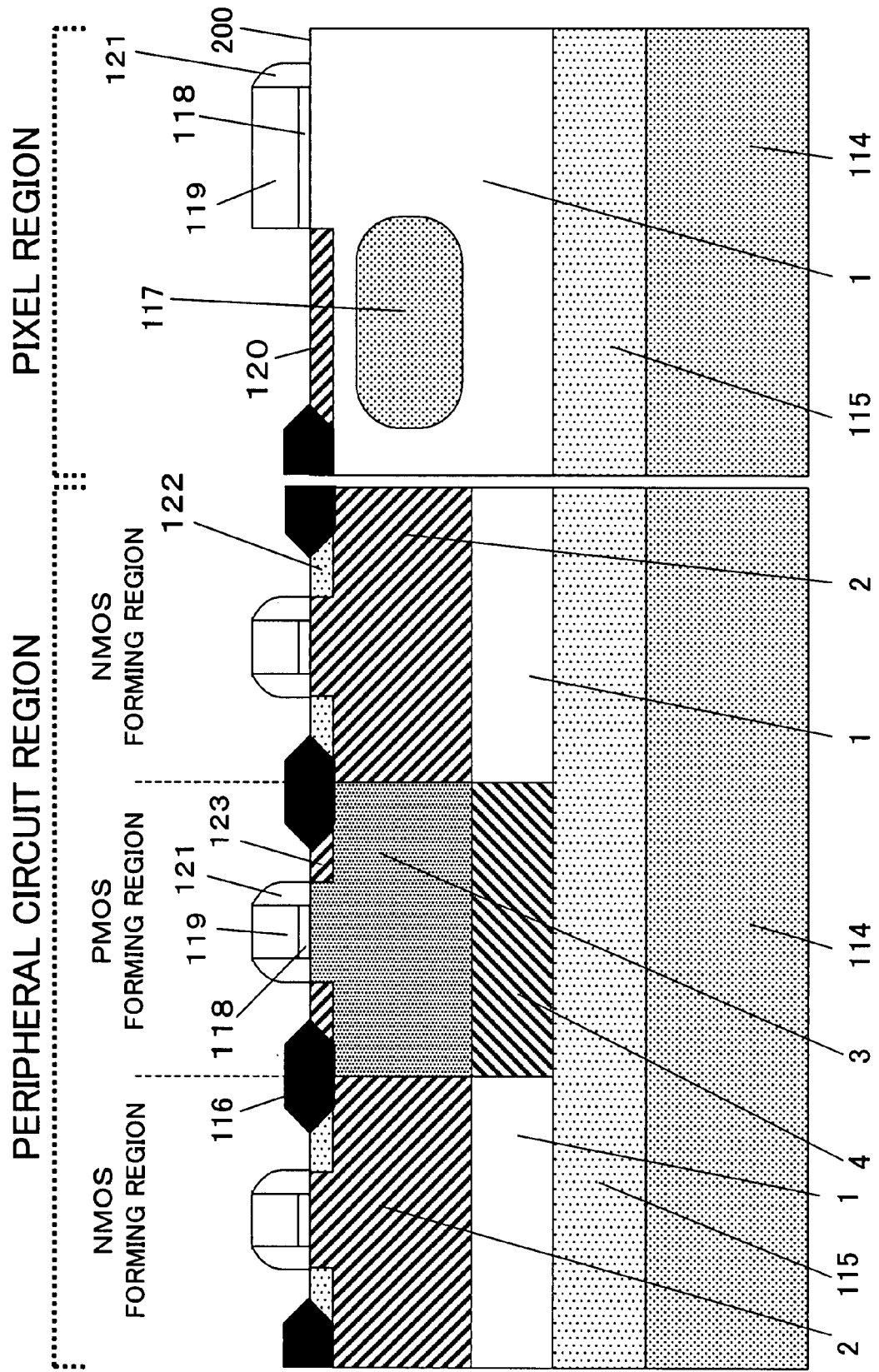
FIG. 5 shows another MOS solid-state image pickup device of the first embodiment.

FIG. 5 shows another MOS solid-state image pickup device of the first embodiment. As shown in FIG. 5, similarly to the conventional MOS solid-state image pickup device (see FIG. 11), the N-type well 3 has a same thickness as that of the P-type wells 2. The P-type well 4 is formed to be positioned below the N-type well 3, and a thickness of the P-type well 4 is the same as an interval between the N-type well 3 and N-type epitaxial layer 115. Here, the P-type well 4 has a higher impurity concentration than that of the P-type well 1, and the impurity concentration of the P-type well 4 is preferred to be no less than $10^{17}/cm^3$. When impurities to be added at the time of forming the P-type well 4 are boron (B), ion implantation is performed, for example, at an implantation energy of 1000 keV to 3500 keV with a dose amount of $1E13/cm^2$ to $1E14/cm^2$. The above configuration does not provide an effect in which by widening the interval between the N-type well 3 and N-type epitaxial layer 115, an improved characteristic for electrically isolating the N-type well 3 and the N-type epitaxial layer 115 from each other is obtained. However, this configuration provides the above-described effect in which by setting the impurity concentration of the P-type well 4 to be higher than that of the P-type well 1, a characteristic for electrically isolating the N-type well 3 and the N-type epitaxial layer 115 from each other is improved whereby the punch-through current is prevented.

Second Embodiment

Figure 6:
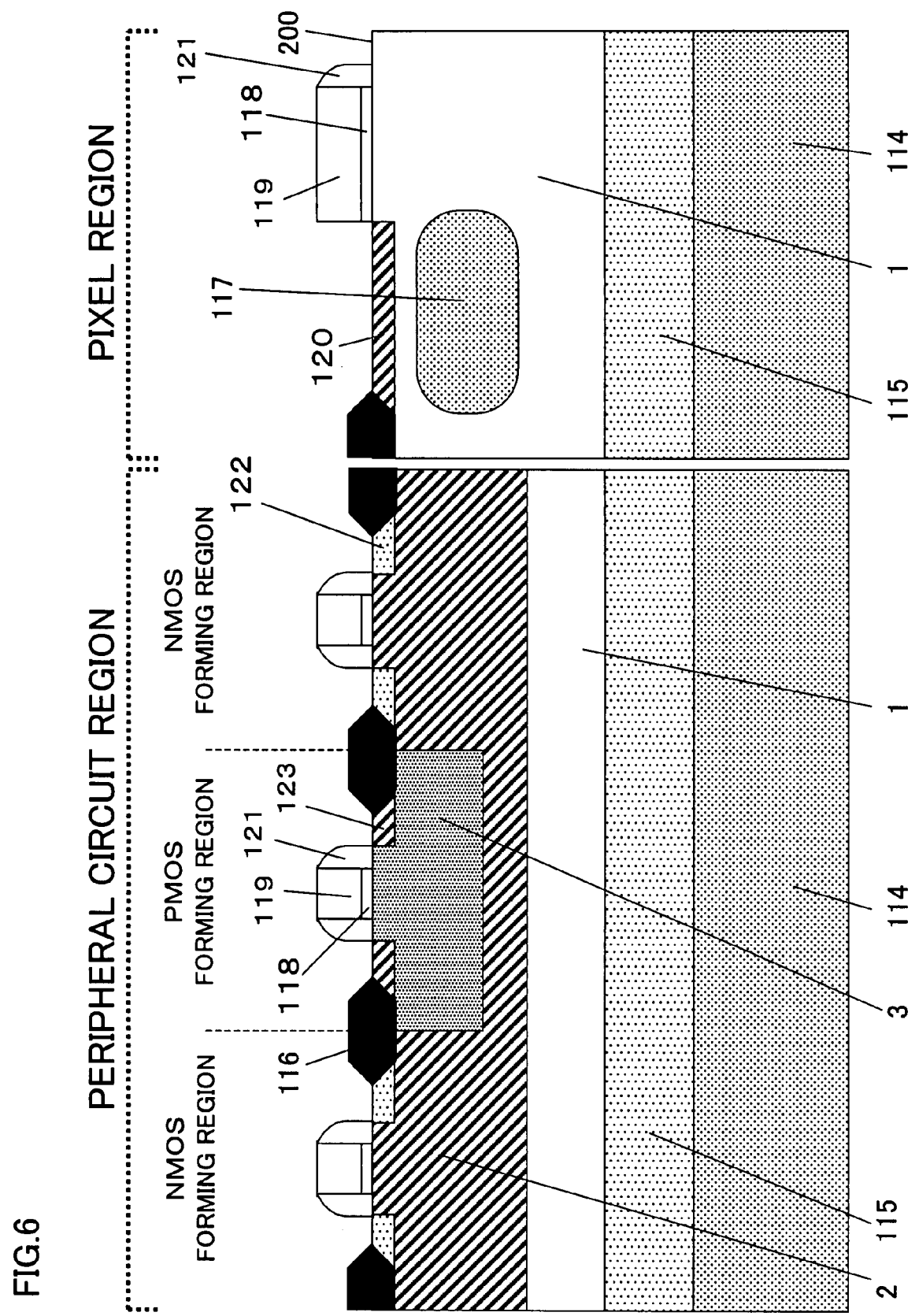
FIG. 6 shows a MOS solid-state image pickup device of a second embodiment.

FIG. 6 shows a MOS solid-state image pickup device of a second embodiment. Hereinafter, the MOS solid-state image pickup device of the second embodiment will be described with reference to FIG. 6. The MOS solid-state image pickup device of the second embodiment is different from the MOS solid-state image pickup device of the first embodiment in that the P-type well 2 is formed such that a part of the P-type well 2, instead of the P-type well 4, is positioned blow the N-type well 3. Hereinafter, a description will be given with a focus on this difference. In FIG. 6, components, which are the same as those of the MOS solid-state image pickup device of the first embodiment (see FIG. 1), are denoted by the same reference numerals as those used for the components of the first embodiment.

As shown in FIG. 6, the MOS solid-state image pickup device of the second embodiment comprises the N-type semiconductor substrate 114, N-type epitaxial layer 115, P-type well 1, N-type light receiving section 117, P-type well 2, N-type well 3, element isolation sections 116, light receiving section surface P-type region 120, source-drain regions 122 of transistors, source-drain regions 123 of a transistor, gate insulating films 118, gate electrodes 119, and the sidewall spacers 121. In FIG. 6, interlayer dielectrics, wirings, microlenses and the like are not shown.

In each of the pixel region and the peripheral circuit region, the N-type epitaxial layer 115 is formed so as to be positioned above the N-type semiconductor substrate 114, and the P-type well 1 which is a retrograde well is formed to be positioned above the N-type epitaxial layer 115. In the pixel region, the N-type light receiving section 117 is formed to be positioned within the P-type well 1, and the light receiving section surface P-type region 120 is formed to be positioned at the semiconductor substrate surface 200. The P-type well 2, which functions as a NMOS well, is formed to be positioned above the P-type well 1 in each of the NMOS forming regions and the PMOS forming region. The N-type well 3, which functions as a PMOS well, is formed to be positioned above the P-type well 2 in the PMOS forming region. Here, the P-type well 2 has a higher impurity concentration than that of the P-type well 1. It is preferred that the impurity concentration of the P-type well 2 is no less than $10^{17}/cm^3$. The source-drain regions 122 are formed to be positioned above the P-type well 2, and the source-drain regions 123 are formed to be positioned above the N-type well 3. In the pixel and peripheral circuit regions, the element isolation sections 116 are formed to be positioned at the semiconductor substrate surface 200. Also, the gate insulating films 118, gate electrodes 119 and sidewall spacers 121 are formed to be positioned on the semiconductor substrate surface 200.

Figure 11:
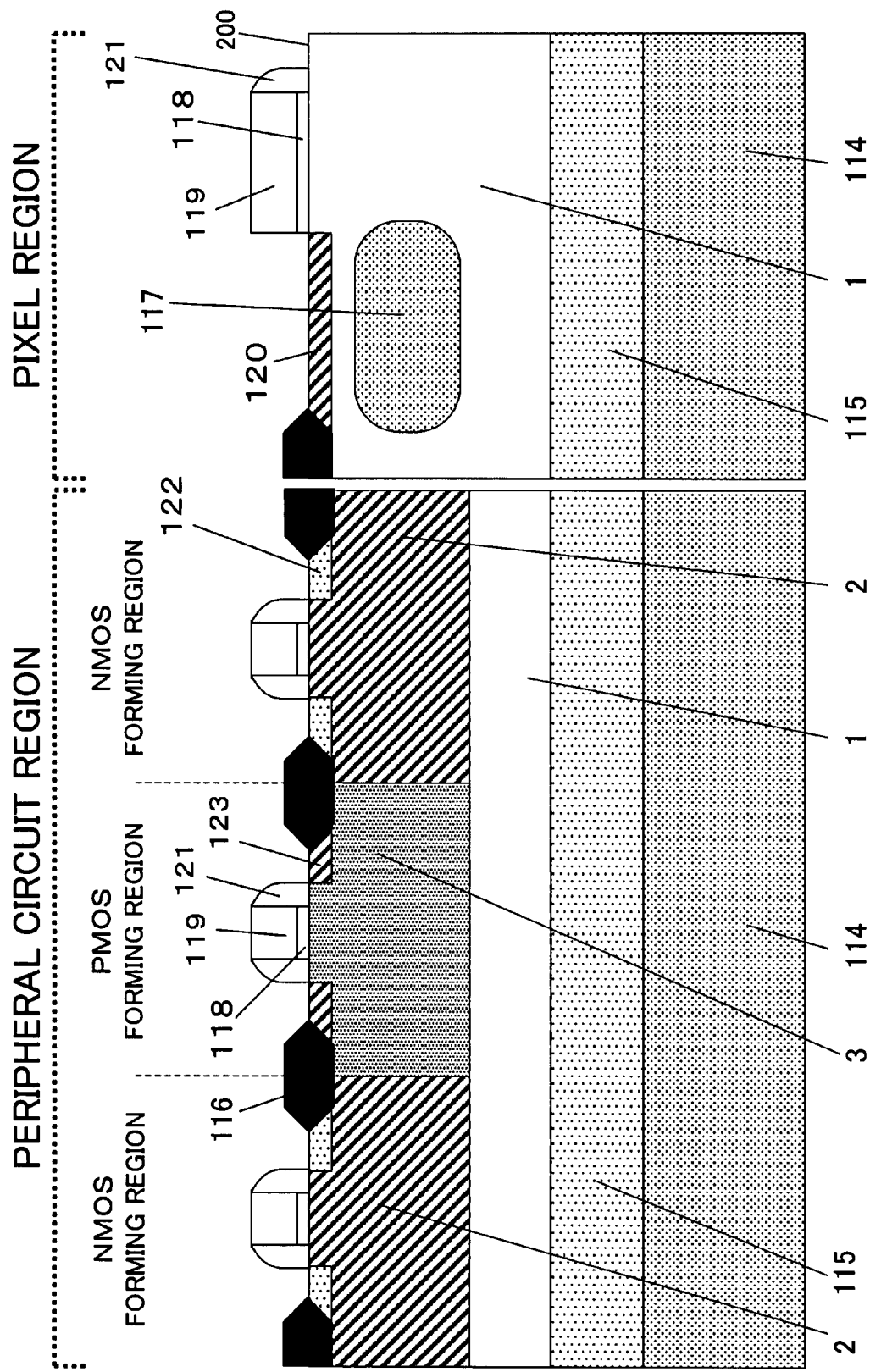
FIG. 11 shows a conventional MOS solid-state image pickup device which has a voltage boosting circuit and which is capable of limiting the occurrence of crosstalk.

The P-type well, for insulating the N-type well 3 and the N-type epitaxial layer 115 from each other, of the MOS solid-state image pickup device of the second embodiment (see FIG. 6) is thicker, by a thickness of the P-type well 2 below the N-type well 3, than that of the conventional MOS solid-state image pickup device (see FIG. 11). For this reason, as compared with the conventional MOS solid-state image pickup device, the MOS solid-state image pickup device of the second embodiment has an improved characteristic for electrically isolating the N-type well 3 and the N-type epitaxial layer 115 from each other. Consequently, the occurrence of punch-through current is prevented. In addition, since the impurity concentration of the P-type well 2 is higher than that of the P-type well 1, a capability for insulating the N-type well 3 and the N-type epitaxial layer 115 from each other is further improved. As a result, the occurrence of punch-through current is further prevented. Moreover, for the reason described in the first embodiment, the MOS solid-state image pickup device of the second embodiment is able to limit the occurrence of crosstalk.

The above described effect is the same as that of the MOS solid-state image pickup device of the first embodiment. However, as will hereinafter be described, when the MOS solid-state image pickup device of the second embodiment is manufactured, a process for forming the P-type well 4 is not necessary. Therefore, a cost of manufacturing the MOS solid-state image pickup device of the second embodiment can be kept lower than a cost of manufacturing the MOS solid-state image pickup device of the first embodiment.

Figure 7:
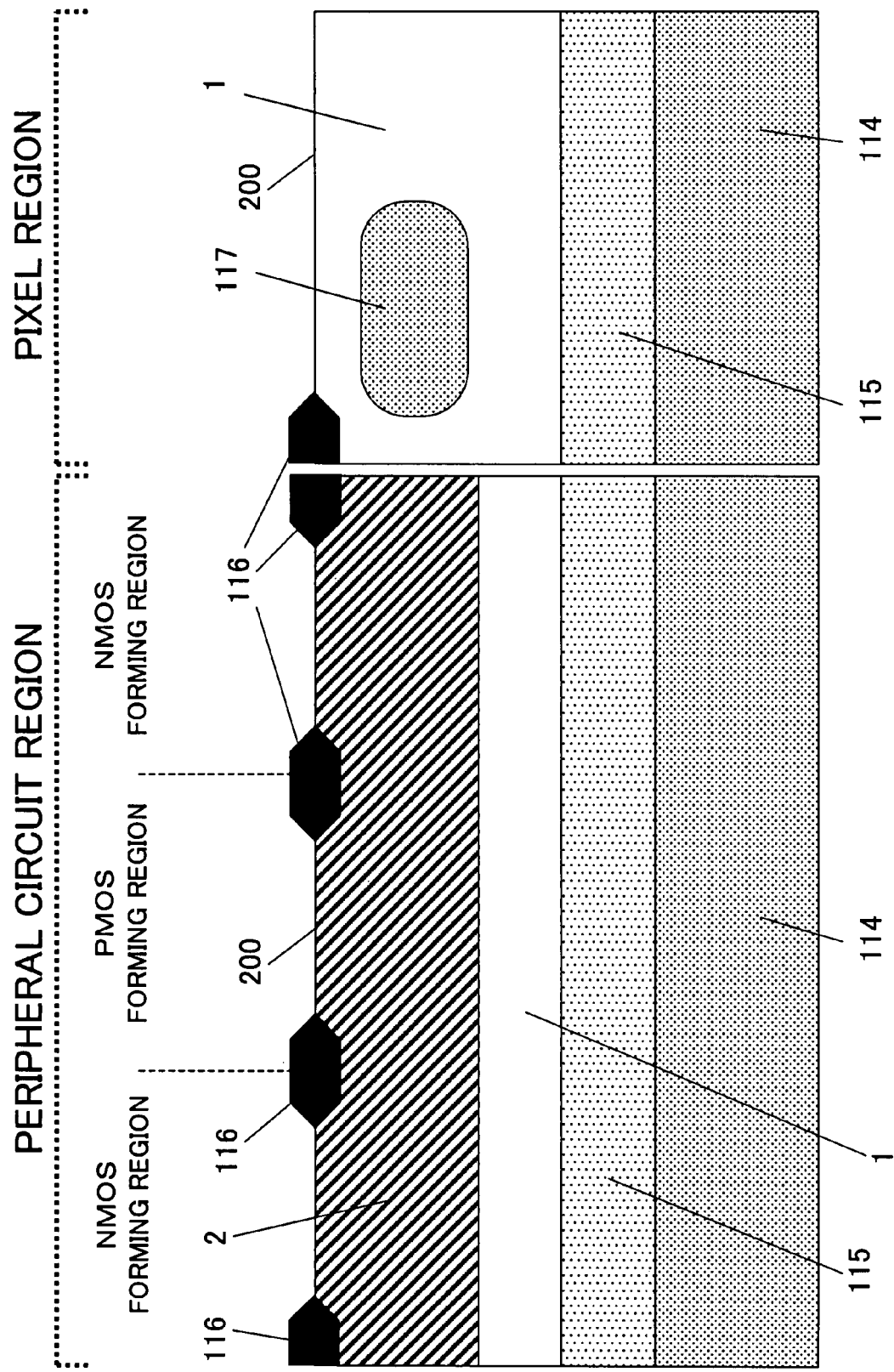
FIG. 7 is a cross-sectional view showing manufacturing processes of the MOS solid-state image pickup device of the second embodiment.
Figure 8:
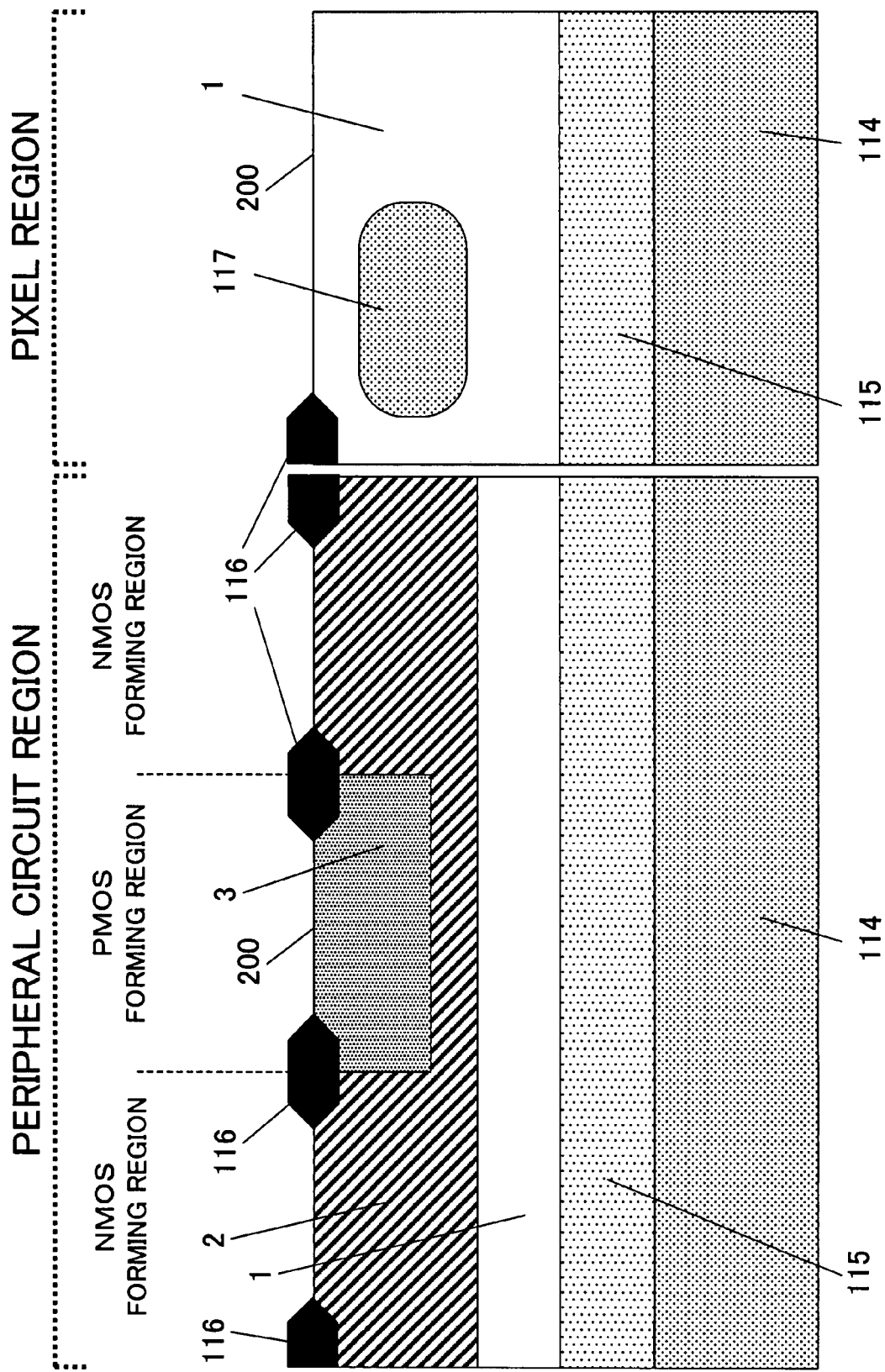
FIG. 8 is another cross-sectional view showing manufacturing processes of the MOS solid-state image pickup device of the second embodiment.

FIGS. 7 and 8 are cross-sectional views each showing manufacturing processes of the MOS solid-state image pickup device of the second embodiment. Hereinafter, a manufacturing method of the MOS solid-state image pickup device of the second embodiment will be described with reference to FIGS. 7 and 8. Since manufacturing processes, which are prior to the manufacturing processes shown in FIG. 7, are the same as those described in the background art (FIG. 12), descriptions thereof will be omitted.

Figure 12:
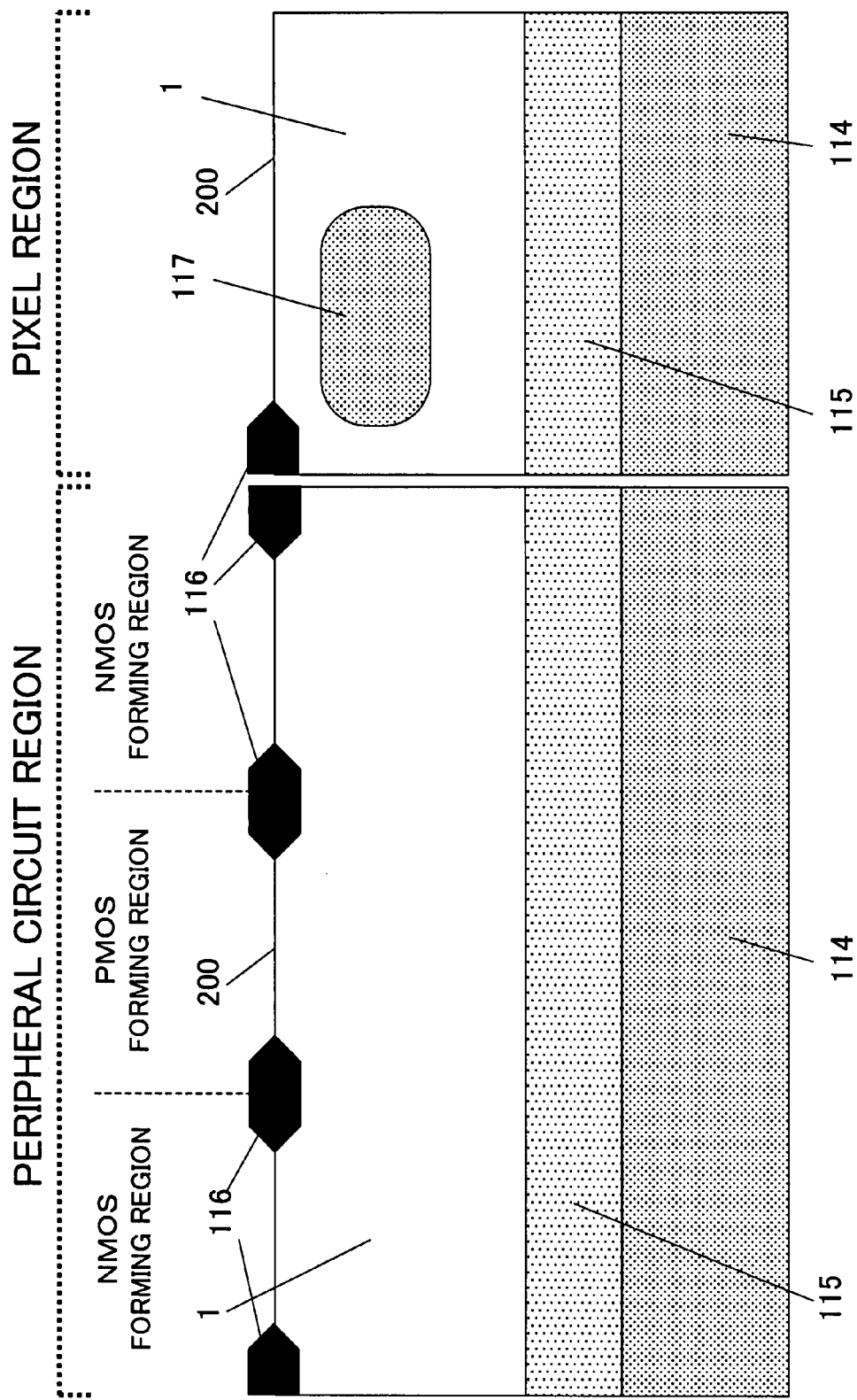
FIG. 12 is a cross-sectional view showing a manufacturing method of the conventional MOS solid-state image pickup device which has a voltage boosting circuit and which is capable of limiting the occurrence of crosstalk.
Figure 13:
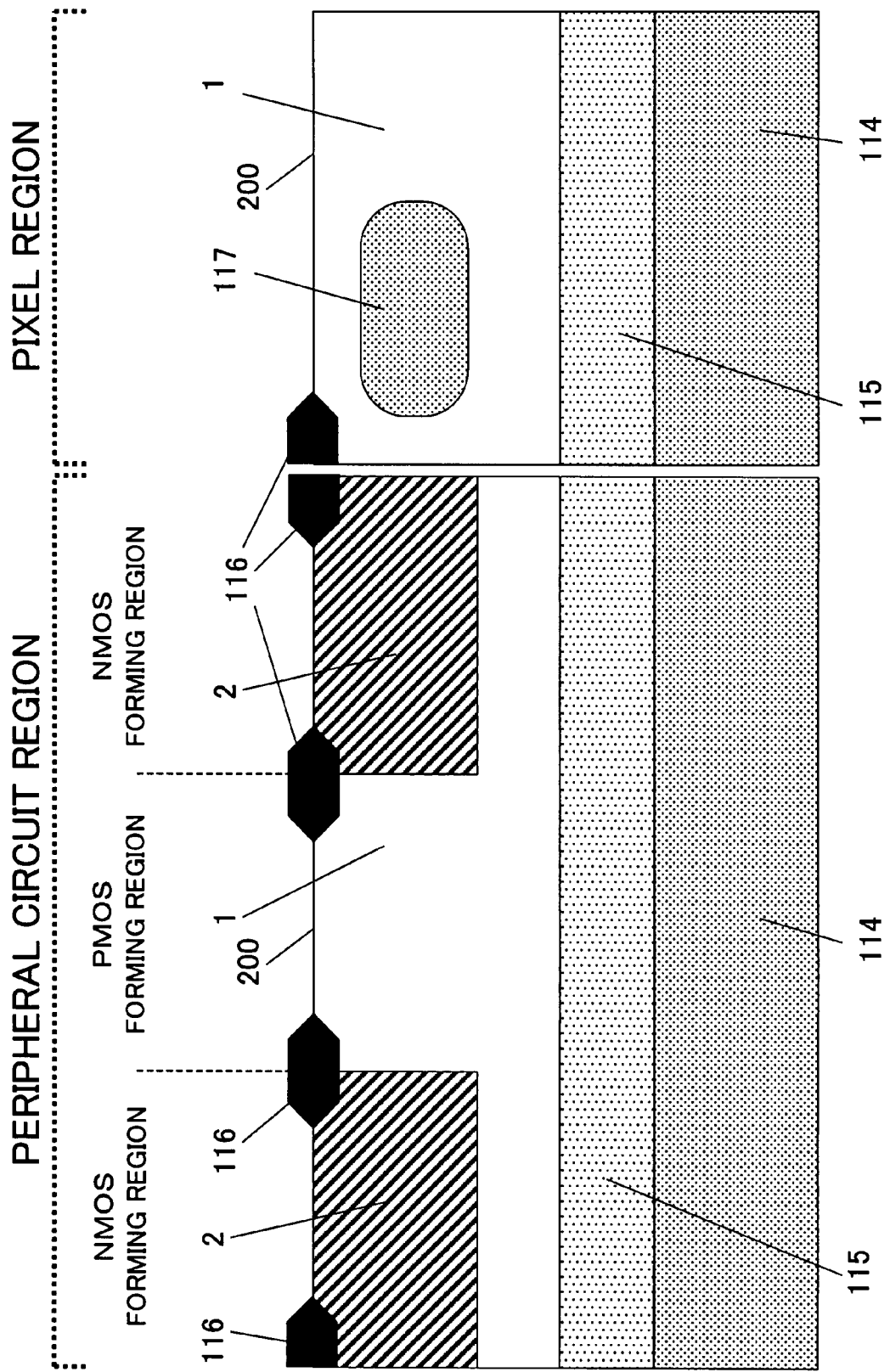
FIG. 13 is another cross-sectional view showing the manufacturing method of the conventional MOS solid-state image pickup device which has a voltage boosting circuit and which is capable of limiting the occurrence of crosstalk.
Figure 14:
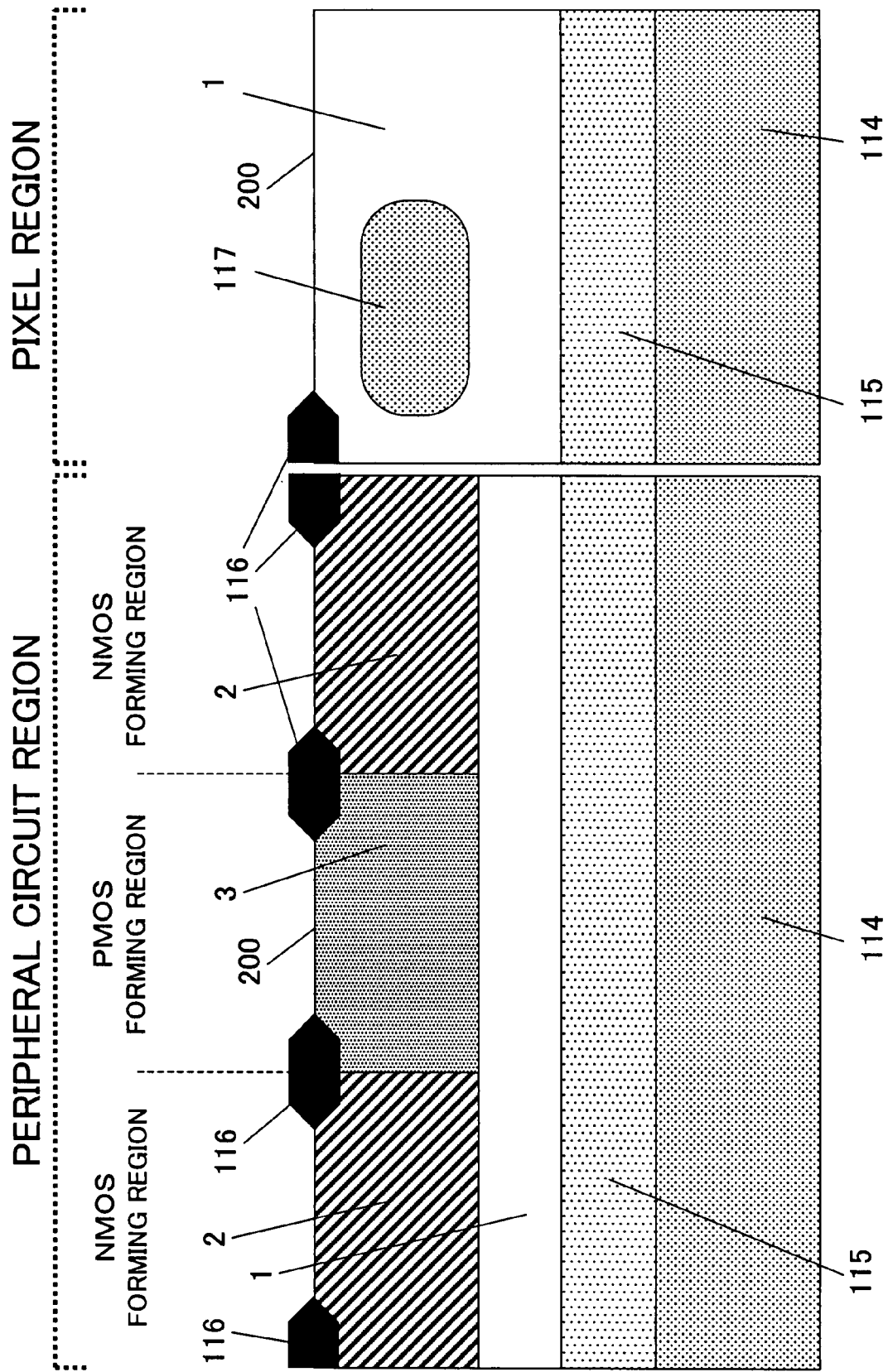
FIG. 14 is another further cross-sectional view showing the manufacturing method of the conventional MOS solid-state image pickup device which has a voltage boosting circuit and which is capable of limiting the occurrence of crosstalk.

First, the state as shown in FIG. 12 is obtained by the conventional manufacturing method described above in the background art. Next, as shown in FIG. 7, the P-type well 2 is formed over the entire peripheral circuit region by ion implantation. At this point, the P-type well 2 is formed to a depth of, e.g., 1 μm to 1.5 μm from the semiconductor substrate surface 200. Here, if added impurities are boron (B), the ion implantation is performed, for example, at an implantation energy of 250 keV to 500 keV with a dose amount of $1E13/cm^2$ to $1E14/cm^2$. It is preferred that the impurity concentration of the P-type well 2 is higher than that of the P-type well 1, and is no less than $10^{17}/cm^3$.

Next, as shown in FIG. 8, the N-type well 3 is formed in the PMOS forming region by ion implantation. Here, the N-type well 3 is formed at a shallower position than that of the P-type well 2. For example, the N-type well 3 is formed from the semiconductor substrate surface 200 to a depth of 1 μm to 1.3 μm. For this reason, the P-type well 2, which has a higher impurity concentration than that of the P-type well 1, is present below the N-type well 3. When impurities to be added for forming the N-type well 3 are, for example, phosphorus (P), ion implantation energy is set to 500 keV to 650 keV. Since the N-type well 3 is formed within the P-type well 2, a dose amount is set to be greater than that for the N-type well 3 of the conventional MOS solid-state image pickup device. For example, the ion implantation is performed with a dose amount of $3E13/cm^2$ to $3E14/cm^2$.

Figure 9:
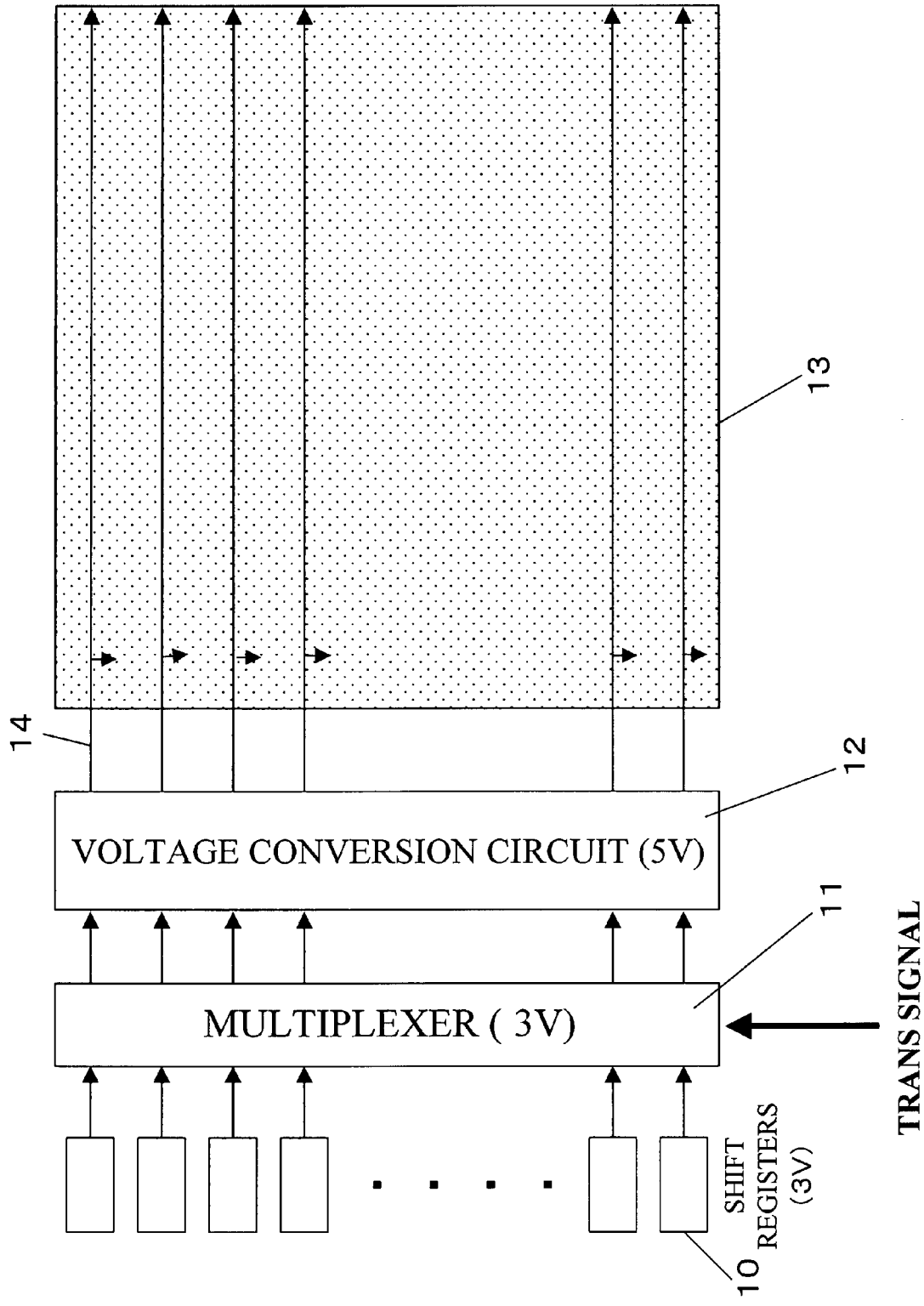
FIG. 9 shows an exemplary MOS solid-state image pickup device having a voltage boosting circuit.

Next, similarly to the conventional manufacturing method of the MOS solid-state image pickup device described with reference to FIG. 11, the gate insulating films 118, gate electrodes 119, sidewall spacers 121 and source-drain regions 122 and 123 are formed. Thereafter, interlayer dielectrics, wirings, microlenses and the like are formed. Thus, the MOS solid-state image pickup device of the second embodiment as shown in FIG. 9 is manufactured in accordance with the above described manufacturing method.

While the invention has been described in detail, the foregoing description is in all aspects illustrative and not restrictive. It is understood that numerous other modifications and variations can be devised without departing from the scope of the invention.

What is claimed is:

1. A MOS solid-state image pickup device comprising, on an N-type semiconductor substrate, a pixel region, in which a plurality of pixels are formed, and a peripheral circuit region in which a peripheral circuit of the pixel region is formed, wherein the pixel region and the peripheral circuit region each include an N-type epitaxial layer which is formed above the N-type semiconductor substrate, the pixel region includes:
   a first P-type well formed above the N-type epitaxial layer; and
   light receiving regions, which are formed within the first P-type well and each of which is a component of a photodiode, and the peripheral circuit region includes:
   second P-type wells, which are formed to a desired depth from a surface of the peripheral circuit region and each of which is a component of an N-Channel MOS transistor;
   an N-type well which is formed to a desired depth from the surface of the peripheral circuit region and which is a component of a P-Channel MOS transistor; and
   a third P-type well which is formed so as to have such a shape as to isolate the N-type well from the N-type epitaxial layer and which has a higher impurity concentration than that of the first P-type well.

2. The MOS solid-state image pickup device according to claim 1, wherein
the first P-type well is a retrograde well having an impurity concentration which increases in accordance with an increase in depth from the surface of the pixel region and which is extremely high at a position deeper than that of a depletion layer generated around each light receiving region.

3. The MOS solid-state image pickup device according to claim 1, wherein the P-Channel MOS transistor is driven by a voltage which has been boosted such that the voltage is higher than an external power supply voltage.

4. The MOS solid-state image pickup device according to claim 1, wherein an impurity concentration of the third P-type well is no less than $10^{17}/cm^3$.

* * * * *